US012689838B2

(12) United States Patent
Song et al.

(10) Patent No.: US 12,689,838 B2
(45) Date of Patent: Jul. 21, 2026

(54) METHOD OF CORRECTING IMAGE DATA OF AN IMAGE SENSOR

(71) Applicant: OMNIVISION TECHNOLOGIES, INC., Santa Clara, CA (US)

(72) Inventors: Yang Song, Sunnyvale, CA (US); Xiaodong Yang, San Jose, CA (US); Chengming Liu, Fremont, CA (US); Rui Ke, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 48 days.

(21) Appl. No.: 19/001,411

(22) Filed: Dec. 25, 2024

(65) Prior Publication Data

US 2026/0181278 A1 Jun. 25, 2026

(51) Int. Cl.

*H04N 25/60* (2023.01)
*H04N 25/46* (2023.01)
*H10F 39/00* (2025.01)
*H10F 39/18* (2025.01)

(52) U.S. Cl.

CPC ............. *H04N 25/60* (2023.01); *H04N 25/46* (2023.01); *H10F 39/18* (2025.01); *H10F 39/8063* (2025.01)

(58) Field of Classification Search

CPC ........ H04N 25/60; H04N 25/46; H10F 39/18; H10F 39/8063

See application file for complete search history.

(56) References Cited

U.S. PATENT DOCUMENTS

| | | | | |
|---|---|---|---|---|
| 7,551,214 B2 * | 6/2009 | Hasegawa | ............ | H04N 25/134 382/162 |
| 12,069,384 B2 * | 8/2024 | Li | ........................ | H04N 25/134 |
| 2021/0126033 A1 * | 4/2021 | Yang | ...................... | H04N 25/11 |

* cited by examiner

*Primary Examiner* — Lin Ye
*Assistant Examiner* — Chriss S Yoder, III
(74) *Attorney, Agent, or Firm* — JC ONE WORLD

(57) ABSTRACT

A method of correcting image data of an image sensor provided herein includes collecting a process window from the image sensor; obtaining weight factors of the process window in various directions based on readout values of the second photodiodes in the process window; obtaining interpolated values of the second photodiodes at positions of the first photodiodes in the first pixel groups in the process window by using the weight factors; and estimating a corrected value $B_{target}$ of a target first photodiode by an equation I: $B_{target}=G_{int}\times(B_{mean}/G_{mean})$, wherein $G_{int}$ is the interpolated value of the second photodiodes at a position of the target first photodiode, $B_{mean}$ is a mean of readout values of first photodiodes in a corresponding first pixel group including the target first photodiode and $G_{mean}$ is a mean of the interpolated values of the second photodiodes at positions of the first photodiodes in the corresponding first pixel group.

12 Claims, 11 Drawing Sheets collecting a process window from the image sensor ⌐S01 obtaining weight factors of the process window in various directions ⌐S02 obtaining interpolated values of the second photodiodes at positions of the first photodiodes in the first pixel groups ⌐S03 estimating a corrected value of each of the first photodiodes ⌐S04

METHOD OF CORRECTING IMAGE DATA OF AN IMAGE SENSOR

BACKGROUND

Technical Field

The disclosure is related to a method of correcting image data of an image sensor.

Description of Related Art

An image sensor includes an array of pixels that are implemented by photosensitive components such as photodiodes and certain optical structures such as color filters, microlenses, or a combination thereof. In one implement, multiple photodiodes are covered by one microlens, which enables phase detection autofocus (PDAF) function. However, the individual readout values of the photodiodes covered by a common one microlens are often imprecise due to the optical side effect of sharing microlens. Therefore, the image data of the image sensor need be improved.

Figure 1:
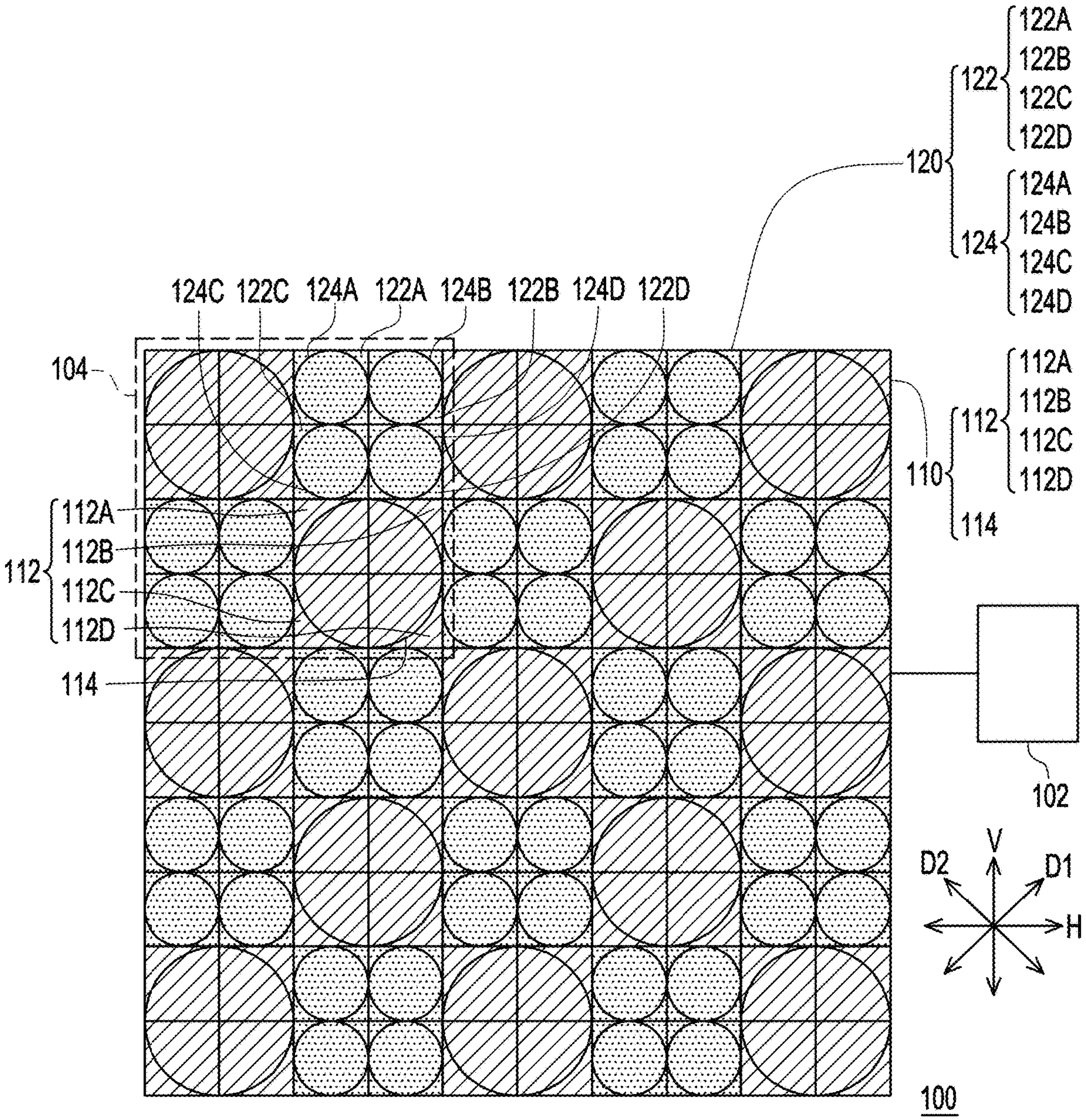
FIG. 1 schematically illustrates a portion of an image sensor in accordance with some embodiments of the disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DESCRIPTION OF THE EMBODIMENTS

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers at least to the context of the present patent application.

FIG. 1 schematically illustrates a portion of an image sensor in accordance with some embodiments of the disclosure. In FIG. 1, an image sensor 100 is connected to a processing computer 102 and the processing computer 102 may receive and process the sensed image data from the image sensor 100 to output the image data of a sensed image. In some embodiments, the sensed image may be displayed through an electronic device. The image sensor 100 includes first pixel groups 110 and second pixel groups 120 alternately arranged along a horizontal direction H and a vertical direction V. In the embodiment, each of the first pixel groups 110 includes four first photodiodes 112 commonly covered by a first microlens 114. Each of the first pixel groups 110 is implemented by a quad photodiode (QPD) configuration. Each of the second pixel groups 120 includes four second photodiodes 122 respectively covered by four microlenses 124. The second pixel groups 120 are implemented by a one photodiode-to-one microlens configuration (also known as 4C or 4 Cells configuration).

In some embodiments, the second pixel groups 120 are configured to sense green color of the incident light, a half of the first pixel groups 110 is configured to sense blue color of the incident light and the other half of the first pixel groups 110 is configured to sense red color of the incident light to form a Bayer pattern-like configuration. For example, two first pixel groups 110 and two second pixel groups 120 are arranged in a 2×2 array to form a pixel unit 104, the two first pixel groups 110 may be arranged diagonally in a first diagonal direction D1, and the two second pixel groups 120 may be arranged diagonally in a second diagonal direction D2. The two first pixel groups 110 in the pixel unit 104 may be one blue pixel group and one red pixel group, and the two second pixel groups 120 in the pixel unit 104 are two green pixel groups.

The photodiodes 112 in one of the first pixel group 110 share one first microlens 114, which is conducive to perform a phase detection autofocus (PDAF) function. Therefore, the image sensor 100 enables fast auto-focus. Each of the second pixel groups 120 is implemented by one single microlens cover one single photodiode and enables high sensing resolution. Specifically, the image sensor 100 having a half-QPD configuration may involve both advantages of the QPD configuration and the 4C configuration.

In some embodiments, the individual readout values of the first photodiodes 112 in the first pixel groups 110 implemented by the QPD configuration may be imprecise owing to the optical side effect and/or the phase shift effect under the design of one microlens covering four photodiodes. However, the total received energy of the incident light by the first photodiodes 112 in each of the first pixel groups 110 is not affected by the optical side effect and/or the phase shift effect. Accordingly, the mean of the individual readout values of the first photodiodes 112 in one first pixel group 110 is precise. In the embodiment, the image data of the image sensor 100 may be corrected by using the following method.

Figure 2:
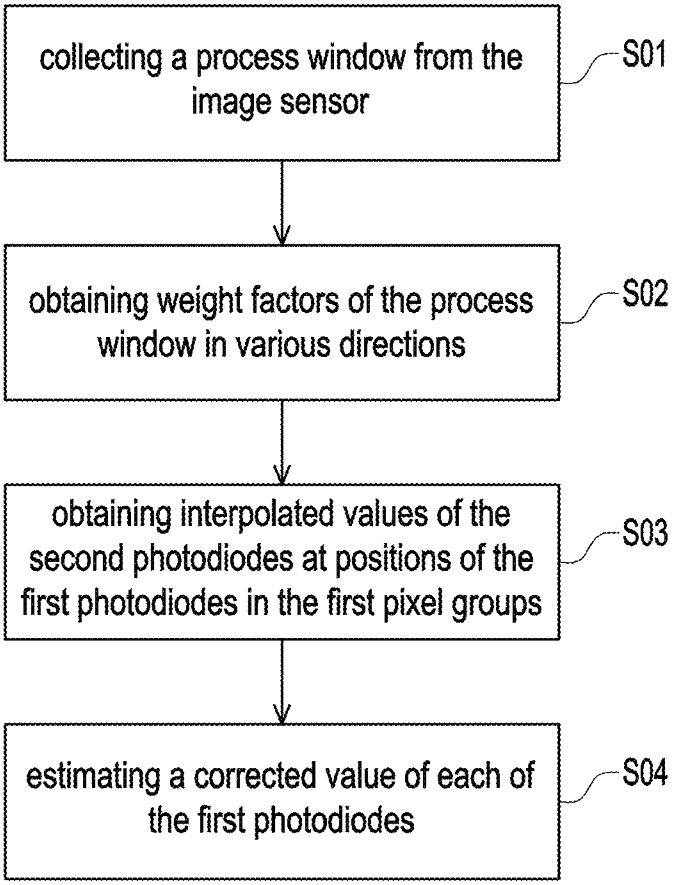
FIG. 2 schematically illustrates a method of correcting image data of an image sensor in accordance with some embodiments of the disclosure.

FIG. 2 schematically illustrates a method of correcting image data of an image sensor in accordance with some embodiments of the disclosure. The method of FIG. 2 may be performed by the processing computer 102 shown in FIG. 1. In FIG. 2, the step S01 includes collecting a process window from the image sensor. As shown in FIG. 1, 10×10 of photodiodes among the first photodiodes 112 and the second photodiodes 122 are collected from the image sensor 100 as the process window. In some embodiments, the processing computer 102 shown in FIG. 1 may perform a pre-process for the readout values provided by the first photodiodes 112 and the second photodiodes 122 before performing the step S01.

The step S02 of obtaining weight factors of the process window in various directions is then performed. Specifically, the weight factor may be obtained based on readout values of the second photodiodes 122 in the process window. In the step S02, the weight factors of the process window may be determined based on the gradients of the readout values of the second photodiodes 122 in various direction. The gradients of the readout values of the second photodiodes 122 in various direction may relate to the graphic feature of the sensed image. For example, the gradient of the readout values of the second photodiodes 122 is small in one component direction, the image may involve a slight change in the component direction so that the readout values of adjacent second photodiodes 122 in the component direction may represent similar feature with high relevance. On the other hand, in the case that the gradient of the readout values of the second photodiodes 122 is large in one component direction, the image may involve an obvious change in the component direction so that the readout values of adjacent second photodiodes 122 in the component direction may represent different features with little relevance. Accordingly, in the embodiment, the weight factor is determined based on the rule that the greater the gradients is the smaller the weight factor is.

The step S03 is performed to obtain interpolated values of the second photodiodes 122 at positions of the first photodiodes 112 in the first pixel groups 110 in the process window. Specifically, the interpolated values of the second photodiodes 122 at positions of the first photodiodes 112 may be obtained by suitable interpolation method. In the embodiment, the interpolated values of the second photodiodes 122 at positions of the first photodiodes 112 is obtained by using the weight factors obtained from the step S02 and readout values of the second photodiodes 122 adjacent to positions of the first photodiodes 112 in various directions.

Thereafter, as shown in the step S04, a corrected value of each of the first photodiodes 112 may be estimated. In the embodiment, the corrected value of each of the first photodiodes 112 may be estimated by using the interpolated value of the second photodiodes 122 at a position of the each of the first photodiodes 112. For example, the corrected value of each of the first photodiodes by an equation I: $B_{target}=G_{int}\times(B_{mean}/G_{mean})$, wherein $B_{target}$ is the corrected value of a target one of the first photodiodes 112, $G_{int}$ is the interpolated value of the second photodiodes 122 at a position of the target one of the first photodiodes 112, $B_{mean}$ is a mean of readout values of corresponding first photodiodes 112 in the first pixel group 110 including the target one of the first photodiodes 112 and $G_{mean}$ is a mean of the interpolated values of the second photodiodes 122 at the positions of the corresponding first photodiodes 112 in the first pixel group 110 including the target one of the first photodiodes 112. After obtaining the corrected values of the first photodiodes 112, the corrected values of the first photodiodes 112 may be output as the image data of the image sensor 100. In other words, the output image data of the image sensor 100 may be constructed by the readout values of the second photodiodes 122 and the corrected values of the first photodiodes 112, which provides a precise image even though the first pixel groups 110 are implemented by the QPD configuration.

FIG. 3 to FIG. 6 respectively illustrate the photodiode array 100A of the collected process window and the pixel group array 100A' of the collected process window, wherein the photodiode array 100A of the collected process window includes 10×10 of photodiodes and the pixel group array 100A' of the collected process window includes 5×5 of pixel groups and each of the pixel groups include 2×2 photodiodes that are binned together. FIG. 3 to FIG. 6 may be used for explaining the steps of obtaining intra-gradients and global-gradients for determining the weight factor in various directions. In some embodiments, each of the gradient value obtained from FIG. 3 to FIG. 6 may be converted to the weight factor by an equation II: $Y_n=X_n^{(-\theta)}$, wherein $Y_n$ is the weight factor, $X_n$ is the gradient value, n indicates the component direction and θ is a positive number. In the embodiment, the letter "n" is "h" when the component direction is the horizontal direction H, the letter "n" is "v" when the component direction is the vertical direction V, the letter "n" is "p" when the component direction is the first diagonal direction D1 and the letter "n" is "q" when the component direction is the second diagonal direction D2. In addition, θ may be selected from 0.7~3.0, but the disclosure is not limited thereto.

Figure 3:
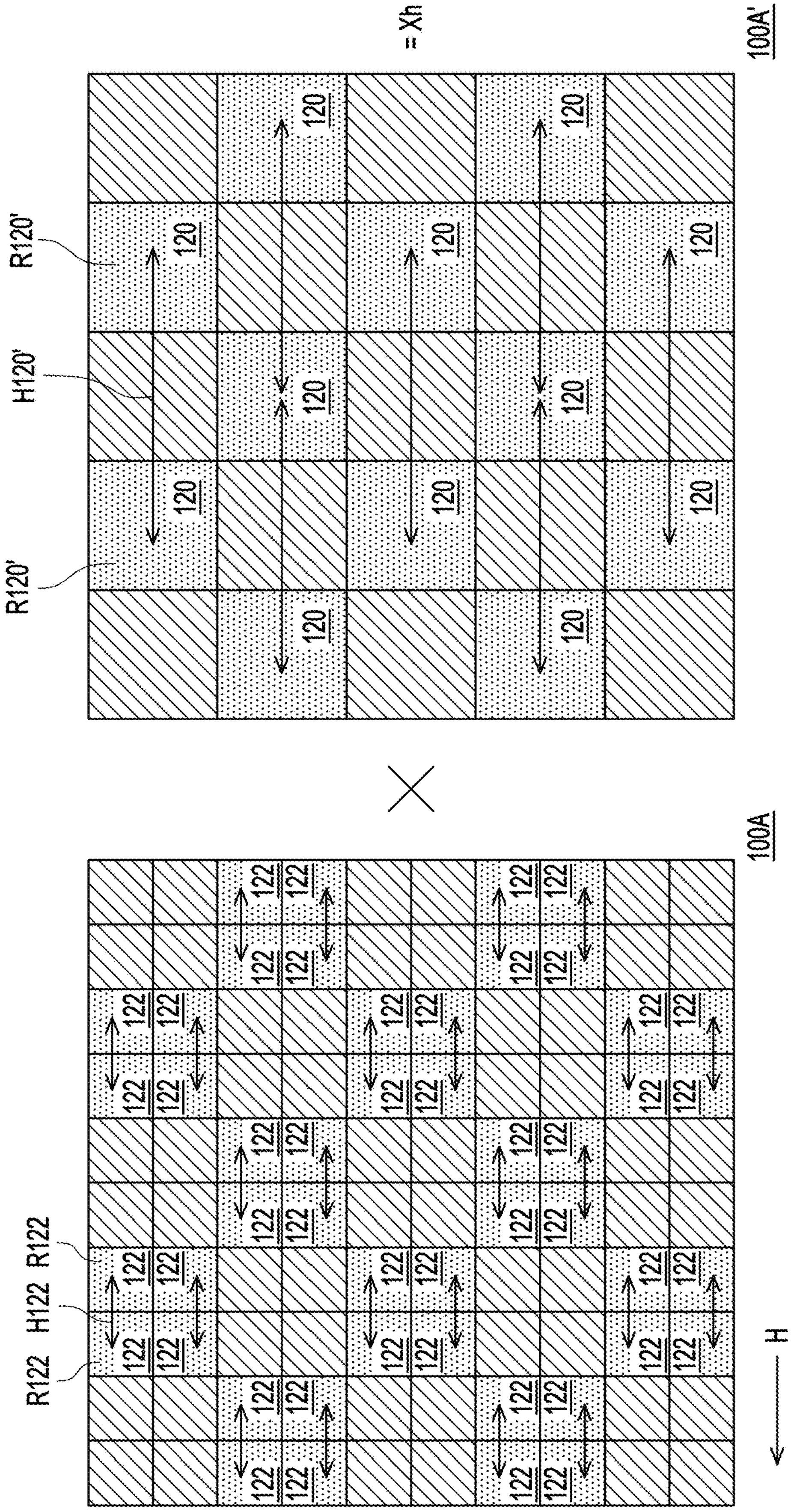
FIG. 3 to FIG. 6 respectively illustrate the photodiode array 100A of the collected process window and the pixel group array 100A' of the collected process window for explaining the steps of determining the weight factor in various directions.

As shown in FIG. 3, each of the second photodiodes 122 in the photodiode array 100A provides a readout value R122. Each of the intra-gradients H122 is obtained by calculating an absolute value of a difference between the readout values R122 of two adjacent second photodiodes 122 in the horizontal direction H. In the photodiode array 100A, each of the double arrows showing the intra-gradients H122 points to the two adjacent second photodiodes 122 in the horizontal direction H. Each of the second pixel groups 120 in the pixel group array 100A' provides a binned value R120', and the binned value R120' of each of the second pixel groups 120 is obtained by binning the readout values of the four second photodiodes 122 (shown in FIG. 1) in the each of the second pixel groups 120. Each of the global-gradients H120' is obtained by calculating an absolute value of a difference of the binned values R120' of two adjacent second pixel groups 120 adjacently arranged in the horizontal direction H. In the pixel group array 100A', each of the double arrows showing the global-gradients H120' points to the two adjacent second pixel groups 120 in the horizontal direction H. After obtaining the intra-gradients H122 and the global-gradients H120', a sum of the intra-gradients H122 and a sum of the global-gradients H120' are multiplied to obtain a gradient value $X_h$ in the horizontal direction H. The weight factor in the horizontal direction H as described in the step S01 is then obtained based on the gradient value $X_h$, wherein the greater the gradient value $X_h$ is the smaller the weight factor is. For example, the weight factor in the horizontal direction H may be represented as $Y_h$ and obtained from the equation II: $Y_h=X_h^{(-\theta)}$, wherein θ is 0.9 or other positive number and h indicates the horizontal direction H.

Figure 4:
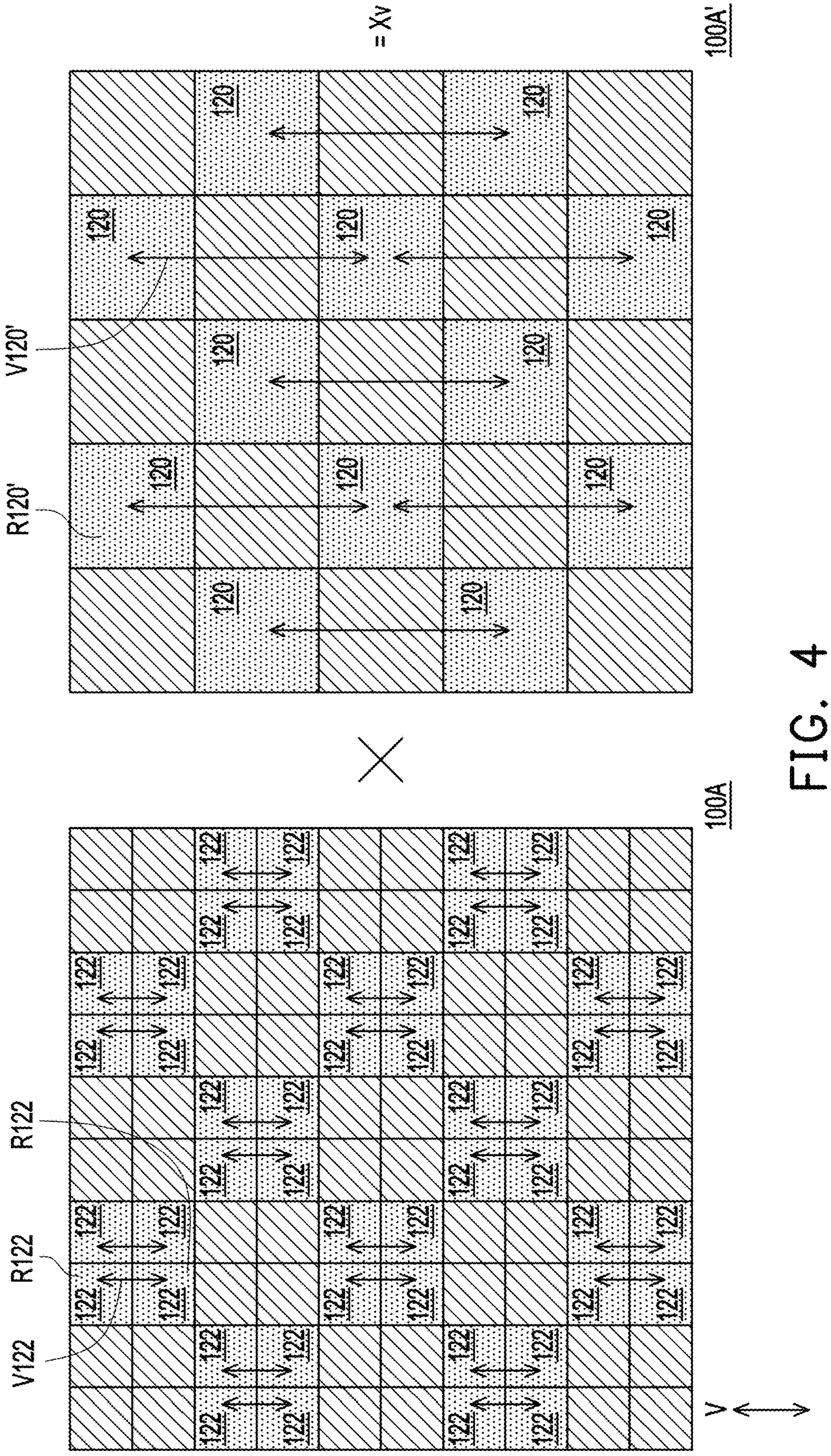

As shown in FIG. 4, each of the second photodiodes 122 in the photodiode array 100A provides a readout value R122. Each of the intra-gradients V122 is obtained by calculating an absolute value of a difference between the readout values R122 of two adjacent second photodiodes 122 in the vertical direction V. In the photodiode array 100A, each of the double arrows showing the intra-gradients V122 points to the two adjacent second photodiodes 122 in the vertical direction V. Each of the second pixel groups 120 in the pixel group array 100A' provides a binned value R120', and the binned value R120' of each of the second pixel groups 120 is obtained by binning the readout values of the four second photodiodes 122 (shown in FIG. 1) in the each of the second pixel groups 120. Each of the global-gradients V120' is obtained by calculating an absolute value of a difference of the binned values R120' of two adjacent second pixel groups 120 adjacently arranged in the vertical direction V. In the pixel group array 100A', each of the double arrows showing the global-gradients V120' points to the two adjacent second pixel groups 120 in the vertical direction V. After obtaining the intra-gradients V122 and the global-gradients V120', a sum of the intra-gradients V122 and a sum of the global-gradients V120' are multiplied to obtain a gradient value $X_v$ in the vertical direction V. The weight factor in the vertical direction V as described in the step S02 is obtained based on the gradient value $X_v$, wherein the greater the gradient value $X_v$ is the smaller the weight factor is. For example, the weight factor in the vertical direction V may be represented as $Y_v$ and obtained from the equation II: $Y_v=X_v^{(-\theta)}$, wherein n indicated the component direction as the vertical direction V, and θ is 0.9 or other positive number.

Figure 5:
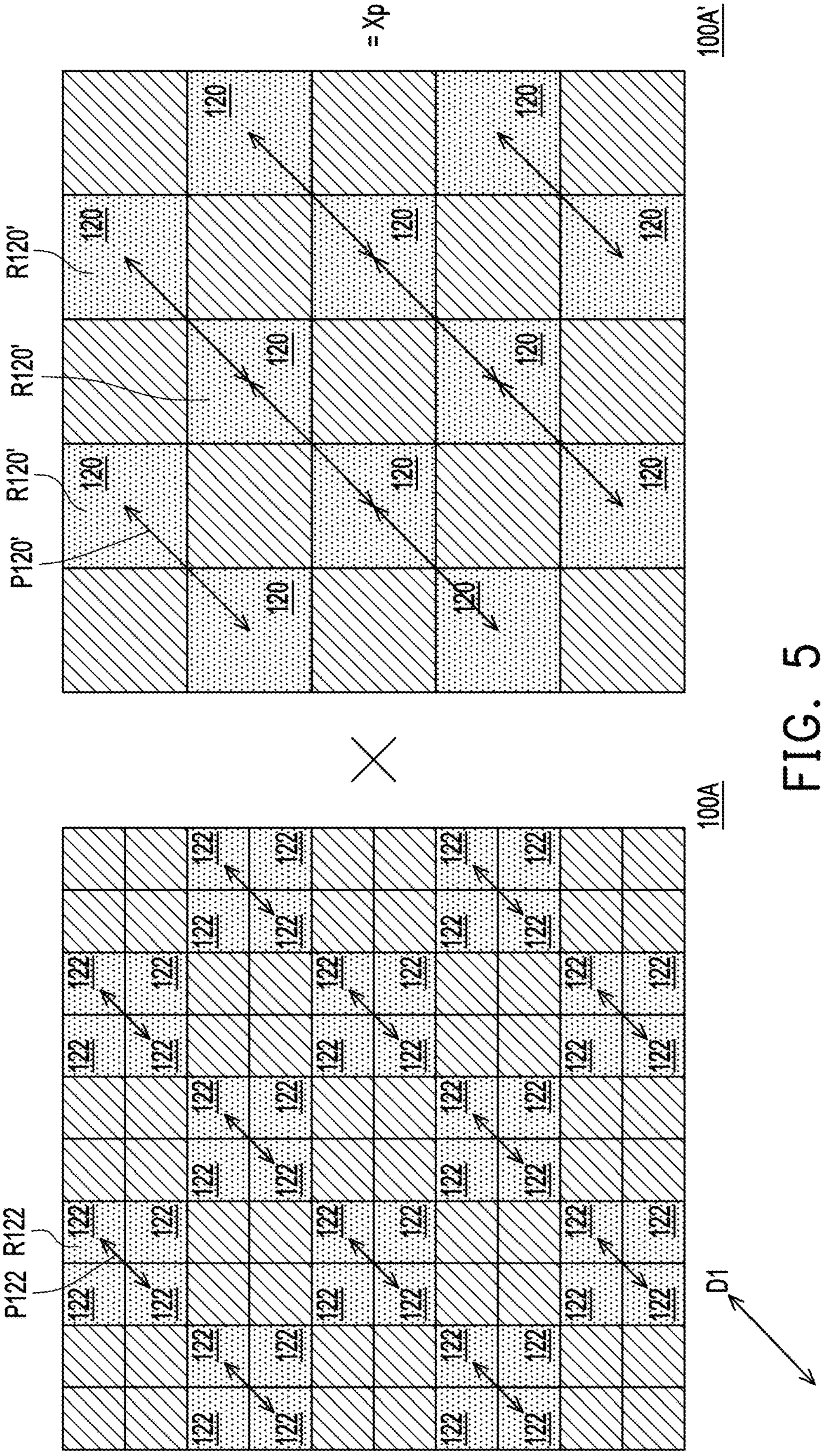

As shown in FIG. 5, each of the second photodiodes 122 in the photodiode array 100A provides a readout value R122. Each of the intra-gradients P122 is obtained by calculating an absolute value of a difference between the readout values R122 of two adjacent second photodiodes 122 in the first diagonal direction D1. In the photodiode array 100A, each of the double arrows showing the intra-gradients P122 points to the two adjacent second photodiodes 122 in the first diagonal direction D1. Each of the second pixel groups 120 in the pixel group array 100A' provides a binned value R120', and the binned value R120' of each of the second pixel groups 120 is obtained by binning the readout values of the four second photodiodes 122 (shown in FIG. 1) in the each of the second pixel groups 120. Each of the global-gradients P120' is obtained by calculating an absolute value of a difference of the binned values R120' of two adjacent second pixel groups 120 adjacently arranged in the first diagonal direction D1. In the pixel group array 100A', each of the double arrows showing the global-gradients P120' points to the two adjacent second pixel groups 120 in the first diagonal direction D1. After obtaining the intra-gradients P122 and the global-gradients P120', a sum of the intra-gradients P122 and a sum of the global-gradients P120' are multiplied to obtain a gradient value $X_p$ in the first diagonal direction D1. The weight factor in the first diagonal direction D1 as described in the step S02 is obtained based on the gradient value $X_p$, wherein the greater the gradient value $X_p$ is the smaller the weight factor is. For example, the weight factor in the first diagonal direction D1 may be represented as $Y_p$ and obtained from the equation II: $Y_p=X_p^{(-\theta)}$, wherein p indicates that the component direction is the first diagonal direction D1, and θ is 0.9 or other positive number.

Figure 6:
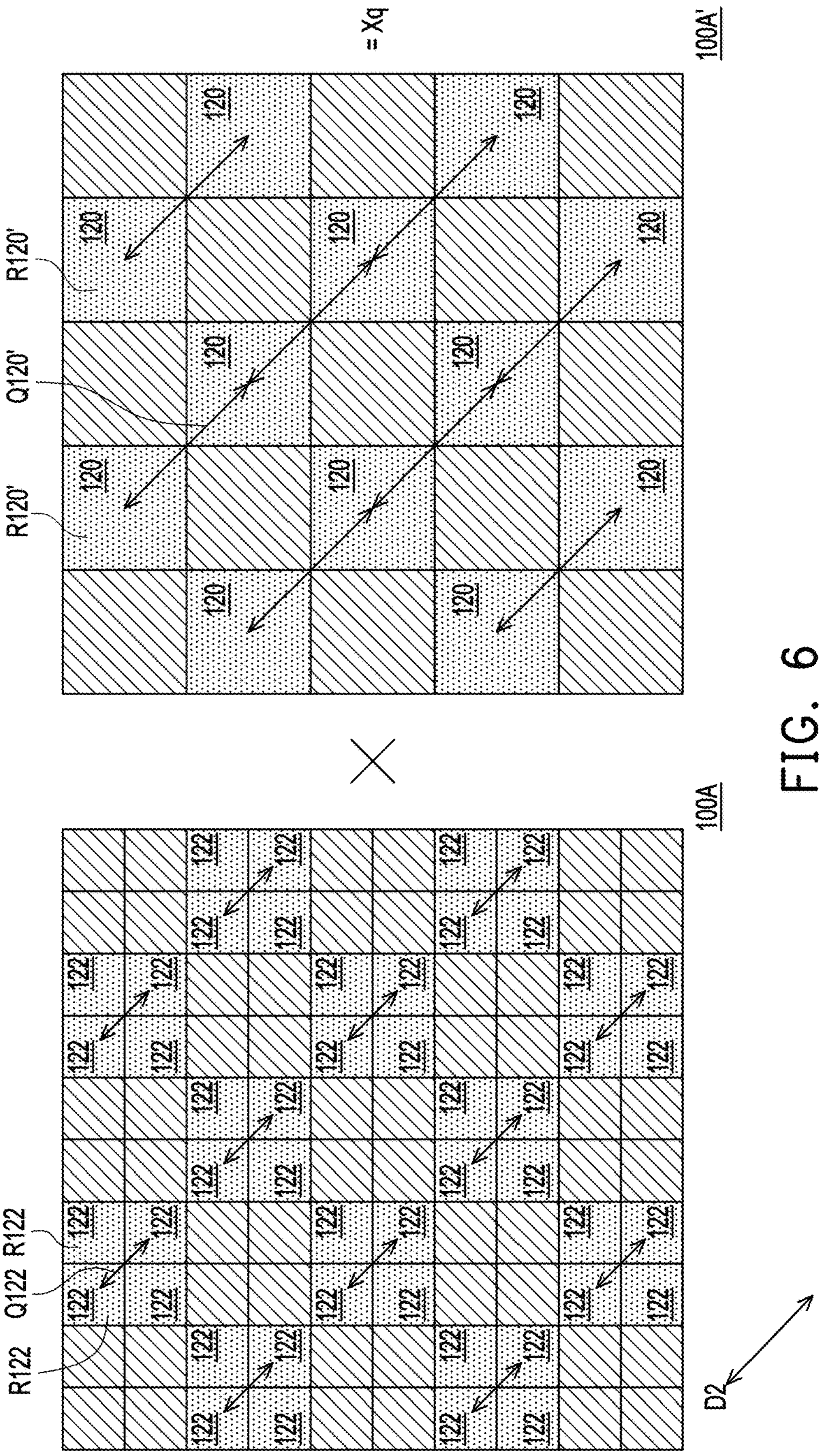

As shown in FIG. 6, each of the second photodiodes 122 in the photodiode array 100A provides a readout value R122. Each of the intra-gradients Q122 is obtained by calculating an absolute value of a difference between the readout values R122 of two adjacent second photodiodes 122 in the second diagonal direction D2. In the photodiode array 100A, each of the double arrows showing the intra-gradients Q122 points to the two adjacent second photodiodes 122 in the second diagonal direction D2. Each of the second pixel groups 120 in the pixel group array 100A' provides a binned value R120', and the binned value R120' of each of the second pixel groups 120 is obtained by binning the readout values of the four second photodiodes 122 (shown in FIG. 1) in the each of the second pixel groups 120. Each of the global-gradients Q120' is obtained by calculating an absolute value of a difference of the binned values R120' of two adjacent second pixel groups 120 adjacently arranged in the second diagonal direction D2. In the pixel group array 100A', each of the double arrows showing the global-gradients P120' points to the two adjacent second pixel groups 120 in the second diagonal direction D2. After obtaining the intra-gradients Q122 and the global-gradients Q120', a sum of the intra-gradients Q122 and a sum of the global-gradients Q120' are multiplied to obtain a gradient value $X_q$ in the second diagonal direction D2. The weight factor in the second diagonal direction D2 as described in the step S02 is obtained based on the gradient value $X_q$, wherein the greater the gradient value $X_q$ is the smaller the weight factor is. For example, the weight factor in the second diagonal direction D2 may be represented as $Y_q$ and obtained from $Y_q=X_q^{(-\theta)}$, wherein q indicates that the component direction is the second diagonal direction D2, and θ is 0.9 or other positive number.

Figure 7:
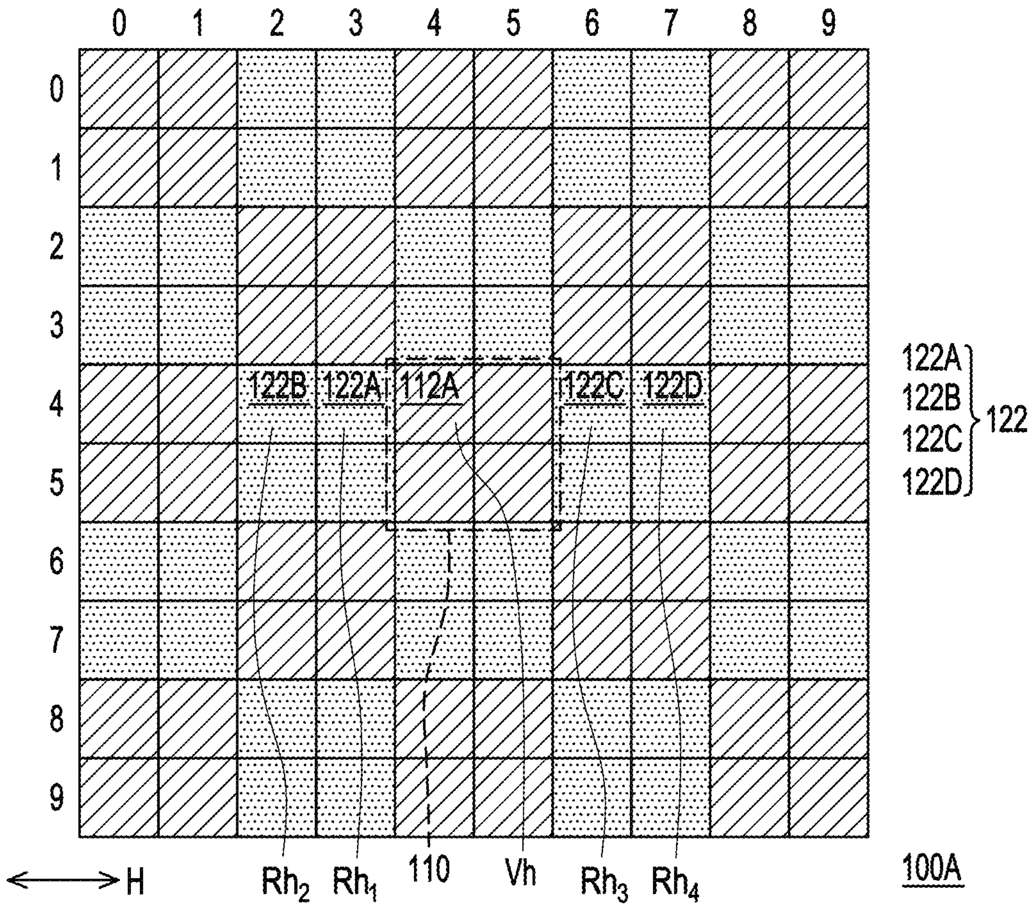
FIG. 7 to FIG. 10 respectively illustrate the photodiode array 100A of the collected process window and show the steps of obtaining component interpolated values of the second photodiodes at a target position.
Figure 8:
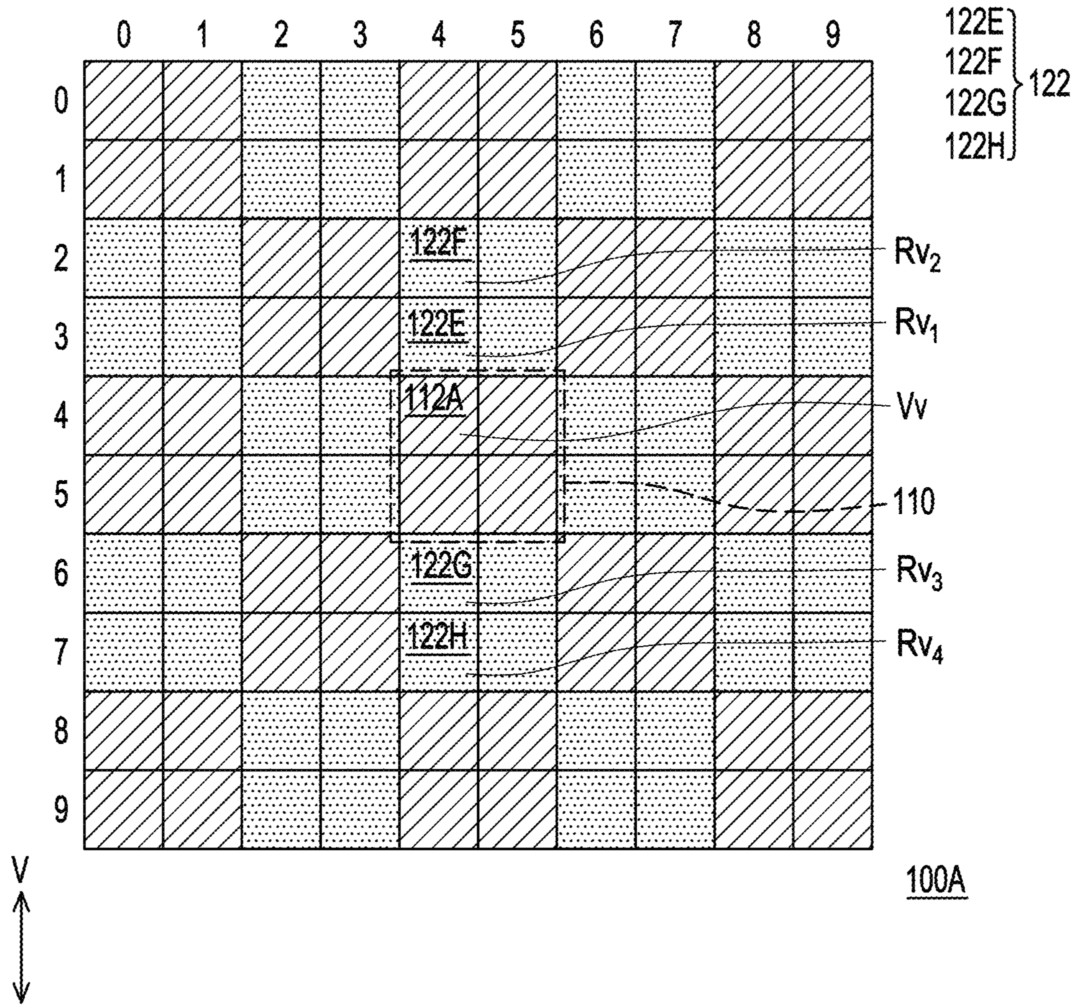
Figure 9:
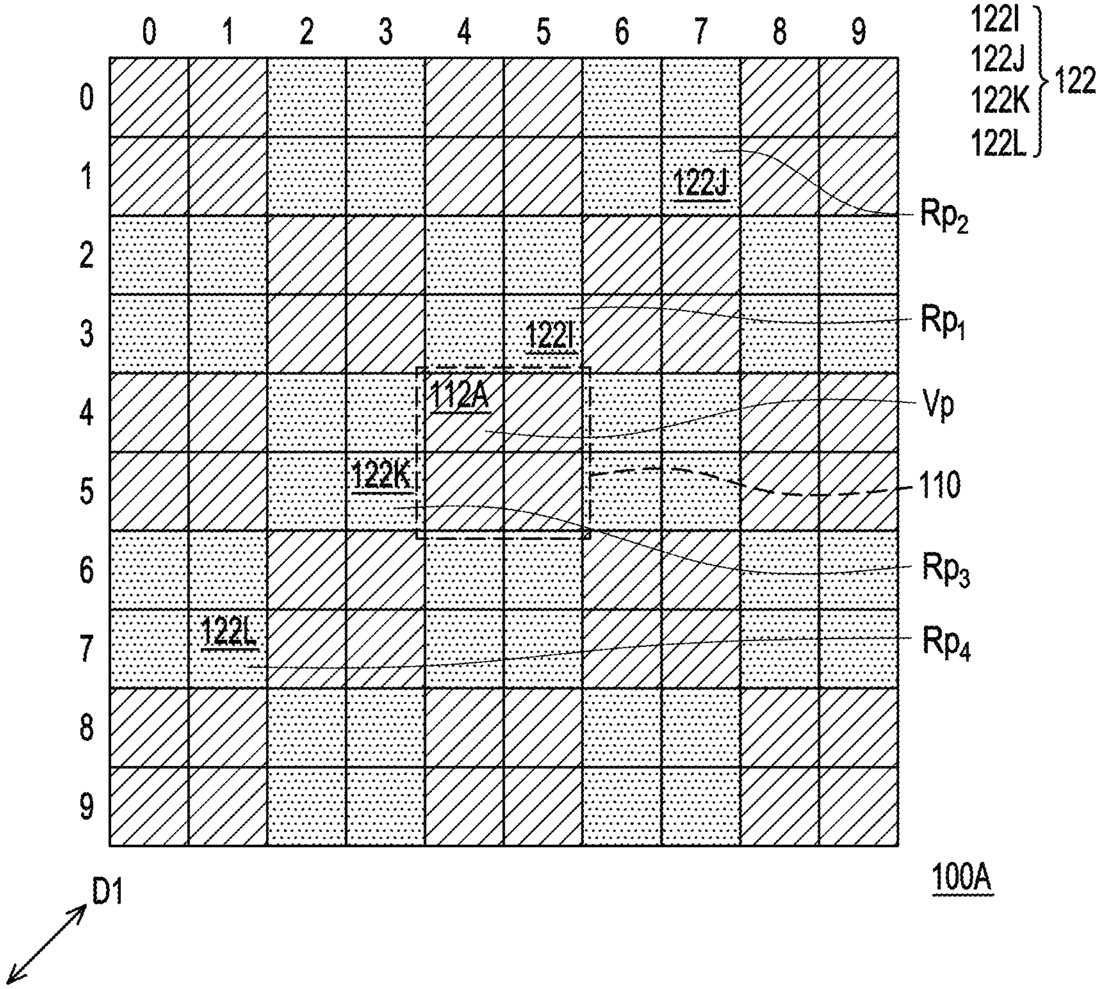
Figure 10:
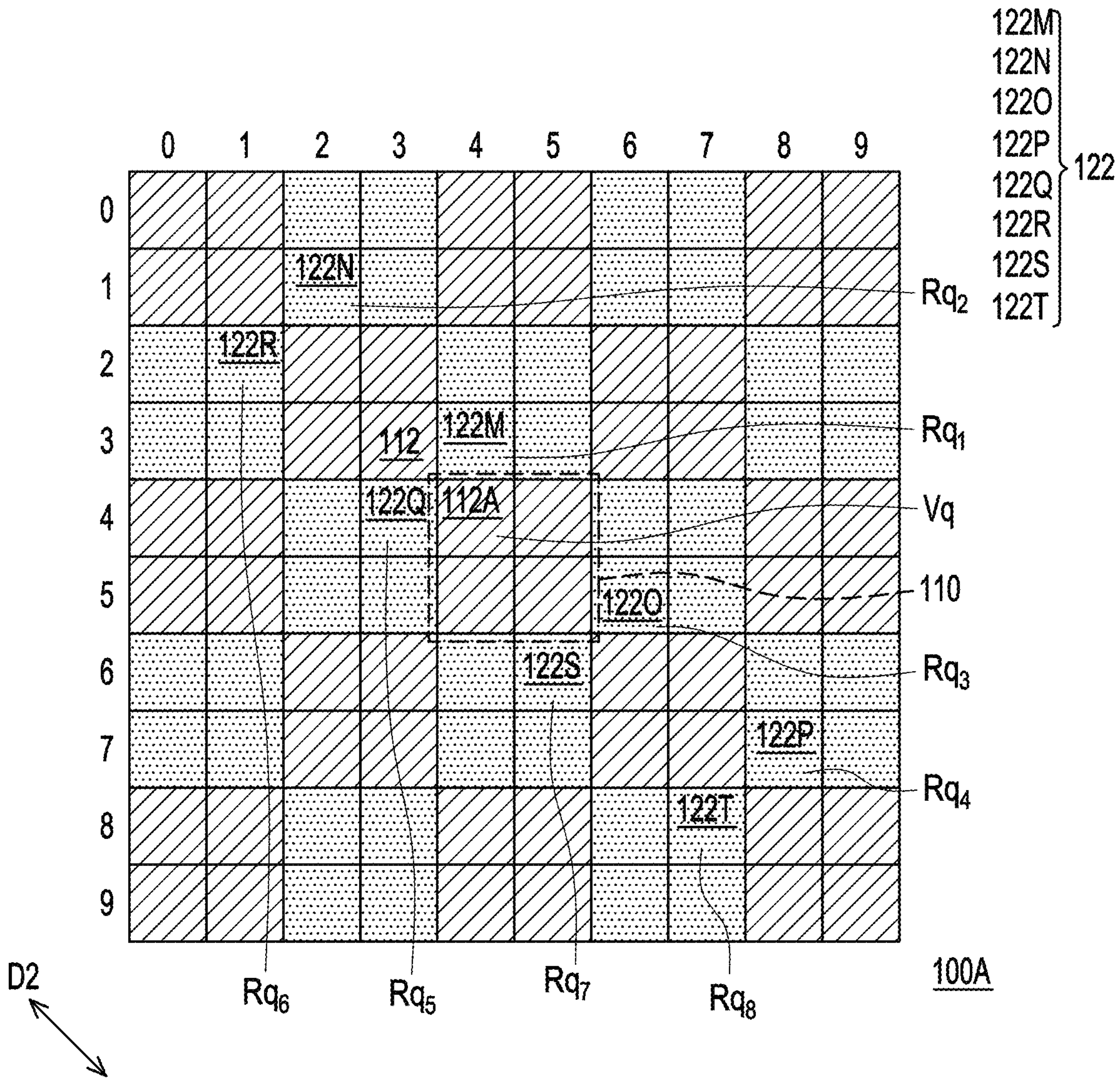

FIG. 7 to FIG. 10 respectively illustrate the photodiode array 100A of the collected process window and show the steps of obtaining component interpolated values of the second photodiodes at a target position of one of the first photodiodes 112 in the first pixel groups 110 shown in FIG. 1 in various directions. Herein, the various directions include four component directions as shown in FIG. 1. Specifically, the step of obtaining the component interpolated value in a horizontal direction H is shown in FIG. 7, the step of obtaining the component interpolated value in a vertical direction V is shown in FIG. 8, the step of obtaining the component interpolated value in a first diagonal direction D1 is shown in FIG. 9 and the step of obtaining the component interpolated value in a second diagonal direction D2 is shown in FIG. 10. In some embodiments, one of the component interpolated values in one component direction is obtained by an equation III:

$$V_n = \left(\sum_{i=1}^{m} Rn_i \times F_i\right) / \sum_{i=1}^{m} F_i,$$

wherein Vn is the component interpolated value in the component direction, n indicates the component direction, $Rn_i$ is a readout value of an $i^{th}$ of the m second photodiodes, and $F_i$ is a component weight value.

FIG. 7 shows the process window includes 10×10 of photodiodes to explain a step of obtaining a component interpolated value of the second photodiodes 122 at a target position (4, 4) of one of the first photodiodes 112, e.g. the target first photodiode 112A, in the first pixel groups 110 shown in FIG. 1 in the process window. Specifically, the method is utilized for correcting the readout value of the target first photodiode 112A located at the position (4, 4) as shown in FIG. 7. For obtaining the component interpolated value at the position (4, 4) in the component direction, e.g. the horizontal direction H, the readout values of m second photodiodes 122 are used. The selected m second photodiodes 122 are arranged in the horizontal direction H, and adjacent to the target position (4, 4) of the target first photodiode 112A. In the embodiment, m is 4 as an example. The four selected second photodiodes 122 are equally located at opposite sides of the target position (4, 4) of the target first photodiode 112A in the horizontal direction H. For example, in the horizontal direction H, two of the selected second photodiodes 122 are located at the left side of the target position (4, 4) and the other two of the selected second photodiodes 122 are located at the right side of the target position (4, 4).

Herein, the equation III:

$$V_n = \left(\sum_{i=1}^{m} Rn_i \times F_i\right) / \sum_{i=1}^{m} F_i$$

may be used for obtaining the component interpolated value, wherein Vn is the component interpolated value in the component direction, n indicates the component direction, $Rn_i$ is a readout value of an $i^{th}$ of the m second photodiodes, and $F_i$ is a component weight value. Specifically, for the example shown in FIG. 7, the second photodiode 122A provides the readout value $Rh_1$, the second photodiode 122B provides the readout value $Rh_2$, the second photodiode 122C provides the readout value $Rh_3$, and the second photodiode 122D provides the readout value $Rh_4$, n is noted as "h" to indicate the horizontal direction H, and the equation III is expanded and expressed as $V_h=(Rh_1\times F_1+Rh_2\times F_2+Rh_3\times F_3+Rh_4\times F_4)/(F_1+F_2+F_3+F_4)$, wherein Vh is the component interpolated value in the horizontal direction H, $Rh_1$~$Rh_4$ are readout values of the selected four second photodiodes 122, respectively, and $F_1$~$F_4$ are component weight values determined by the positions of the corresponding second photodiodes 122.

The second photodiode 122A and the second photodiode 122B are located at a first side of the target position (4, 4) and the second photodiode 122A is more adjacent to the target position (4, 4) than the second photodiode 122B. The component weight value $F_1$ for the readout value $Rh_1$ is greater than the component weight value $F_2$ for the readout value $Rh_2$. For example, the component weight value $F_1$ may be 4 while the component weight value $F_2$ may be 2. Simultaneously, the second photodiode 122C and the second photodiode 122D are located at a second side of the target position (4, 4) and the second photodiode 122C is more adjacent to the target position (4, 4) than the second photodiode 122D. The component weight value $F_3$ for the readout value $Rh_3$ may be 2 while the component weight value $F_4$ for the readout value $Rh_4$ may be 1. Herein, the second photodiode 122A is more adjacent to the target position (4, 4) than the second photodiode 122C and the component weight value $F_1$ for the readout value $Rh_1$ is greater than the component weight value $F_3$ for the readout value $Rh_3$, but the disclosure is not limited thereto. In some embodiments, the values of $F_1$~$F_4$ may be a combination of other values, which satisfies $F_1>F_2$ and $F_3>F_4$.

As shown in FIG. 8, for obtaining the component interpolated value at the position (4, 4) in the vertical direction V from the photodiode array 100A, the readout values of m second photodiodes 122 are used. The selected m second photodiodes 122 are arranged in the vertical direction V, and adjacent to the target position (4, 4) of the first photodiodes 112. In the embodiment, m is 4 as an example. The four selected second photodiodes 122 are equally located at opposite sides of the target position (4, 4) of the target first photodiode 112A in the component direction, the vertical direction V. For example, two of the selected second photodiodes 122 are located at the upper side of the target position (4, 4) and the other two of the selected second photodiodes 122 are located at the bottom side of the target position (4, 4) in the vertical direction V.

Herein, the equation III:

$$V_n = \left(\sum_{i=1}^{m} Rn_i \times F_i\right) / \sum_{i=1}^{m} F_i$$

may be used for obtaining the component interpolated value, wherein Vn is the component interpolated value in the component direction, n indicates the component direction, $Rn_i$ is a readout value of an $i^{th}$ of the m second photodiodes, and $F_i$ is a component weight value. In the embodiment, the second photodiode 122E provides the readout value $Rv_1$, the second photodiode 122F provides the readout value $Rv_2$, the second photodiode 122G provides the readout value $Rv_3$, and the second photodiode 122H provides the readout value $Rv_4$. Specifically, for the component interpolated value in the horizontal direction H, n is noted as "v" and the equation III is expanded and expressed as $V_v=(Rv_1\times F_1+Rv_2\times F_2+Rv_3\times F_3+Rv_4\times F_4)/(F_1+F_2+F_3+F_4)$, wherein $V_v$ is the component interpolated value in the vertical direction V, $Rv_1$~$Rv_4$ are readout values of the selected four second photodiodes 122, respectively, and $F_1$~$F_4$ are component weight values determined by the positions of the corresponding second photodiodes 122.

The second photodiode 122E and the second photodiode 122F are located at a first side of the target position (4, 4) and the second photodiode 122E is more adjacent to the target position (4, 4) than the second photodiode 122F. The component weight value $F_1$ for the readout value $Rv_1$ is greater than the component weight value $F_2$ for the readout value $Rv_2$. For example, the component weight value $F_1$ may be 3 while the component weight value $F_2$ may be 1. Simultaneously, the second photodiode 122G and the second photodiode 122H are located at a second side of the target position (4, 4) and the second photodiode 122G is more adjacent to the target position (4, 4) than the second photodiode 122H. The component weight value $F_3$ for the readout value $Rv_4$ may be 3 while the component weight value $F_4$ for the readout value $Rv_4$ may be 1. In some embodiments, the values of $F_1$~$F_4$ may be a combination of other values, which satisfies $F_1>F_2$ and $F_3>F_4$.

As shown in FIG. 9, for obtaining the component interpolated value at the position (4, 4) in the first diagonal direction D1, the readout values of m second photodiodes 122 are used. The selected m second photodiodes 122 are arranged in the first diagonal direction D1, and adjacent to the target position (4, 4) of the target first photodiode 112A. In the embodiment, m is 4 as an example. The four selected second photodiodes 122 are equally located at opposite sides of the target position (4, 4) of the target first photodiode 112A in the component direction, the first diagonal direction D1. For example, two of the selected second photodiodes 122 are located at the upper-right side of the target position (4, 4) and the other two of the selected second photodiodes 122 are located at the bottom-left side of the target position (4, 4) in the first diagonal direction D1.

Herein, the equation III:

$$V_n = \left(\sum_{i=1}^{m} Rn_i \times F_i\right) / \sum_{i=1}^{m} F_i$$

may be used for obtaining the component interpolated value, wherein Vn is the component interpolated value in the component direction, n indicates the component direction, $Rn_i$ is a readout value of an $i^{th}$ of the m second photodiodes, and $F_i$ is a component weight value. In the embodiment, the second photodiode 122I provides the readout value $Rp_1$, the second photodiode 122J provides the readout value $Rp_2$, the second photodiode 122K provides the readout value $Rp_3$, and the second photodiode 122L provides the readout value $Rp_4$. Specifically, for the component interpolated value in the first diagonal direction D1, n is noted as "p" and the equation III is expanded and expressed as $V_p=(Rp_1\times F_1+Rp_2\times F_2+Rp_3\times F_3+Rp_4\times F_4)/(F_1+F_2+F_3+F_4)$, wherein $V_p$ is the component interpolated value in the first diagonal direction D1, $Rp_1$~$Rp_4$ are readout values of the selected four second photodiodes 122, respectively, and $F_1$~$F_4$ are component weight values determined by the position of the corresponding second photodiode 122.

The second photodiode 122I and the second photodiode 122J are located at a first side of the target position (4, 4) and the second photodiode 122I is more adjacent to the target position (4, 4) than the second photodiode 122J. The component weight value $F_1$ for the readout value $Rv_1$ is greater than the component weight value $F_2$ for the readout value $Rv_2$. For example, the component weight value $F_1$ may be 4 while the component weight value $F_2$ may be 2. Simultaneously, the second photodiode 122K and the second photodiode 122L are located at a second side of the target position (4, 4) and the second photodiode 122K is more adjacent to the target position (4, 4) than the second photodiode 122L. The component weight value $F_3$ for the readout value $Rv_3$ may be 2 while the component weight value $F_4$ for the readout value $Rv_4$ may be 1. In some embodiments, the values of $F_1$~ $F_4$ may be a combination of other values, which satisfies $F_1>F_2$ and $F_3>F_4$.

As shown in FIG. 10, for obtaining the component interpolated value at the position (4, 4) in the component direction, the second diagonal direction D2, the readout values of m second photodiodes 122 are used. The selected m second photodiodes 122 are arranged in the second diagonal direction D2, and adjacent to the target position (4, 4) of the target first photodiode 112A. In the embodiment, m is 8 as an example. The eight selected second photodiodes 122 are equally located at opposite sides of the target position (4, 4) of the first photodiodes 112 in the component direction, the second diagonal direction D2. For example, four of the selected second photodiodes 122 are located at the upper-left side of the target position (4, 4) and the other four of the selected second photodiodes 122 are located at the bottom-right side of the target position (4, 4) in the second diagonal direction D2.

In the photodiode array 100A, the positions arranged in the same linear path of the target position (4, 4) in the second diagonal direction D2 are disposed with the first photodiodes 112 and thus the selected second photodiodes 122 are not arranged in the same linear path of the target position (4, 4) along the second diagonal direction D2. Herein, the second photodiode 122M, the second photodiode 122N, the second photodiode 122O, and the second photodiode 122P are arranged in the same linear path along the second diagonal direction D2, while the second photodiode 122Q, the second photodiode 122R, the second photodiode 122S, and the second photodiode 122T are arranged in the same linear path along the second diagonal direction D2. Along the second diagonal direction D2, the second photodiode 122M and the second photodiode 122Q may keep the same distance from the first photodiodes 112A at the target position (4, 4), the second photodiode 122N and the second photodiode 122R may keep the same distance from the first photodiodes 112A at the target position (4, 4), the second photodiode 122O and the second photodiode 122S may keep the same distance from the first photodiodes 112A at the target position (4, 4), and the second photodiode 122P and the second photodiode 122T may keep the same distance from the first photodiodes 112A at the target position (4, 4).

Herein, the equation III:

$$V_n=\left(\sum_{i=1}^{m}Rn_i\times F_i\right)/\sum_{i=1}^{m}F_i$$

may be used for obtaining the component interpolated value, wherein Vn is the component interpolated value in the component direction, n indicates the component direction, $Rn_i$ is a readout value of an $i^{th}$ of the m second photodiodes, and $F_i$ is a component weight value. Specifically, in the embodiment, the second photodiode 122M provides the readout value $Rq_1$, the second photodiode 122N provides the readout value $Rq_2$, the second photodiode 122O provides the readout value $Rq_3$, and the second photodiode 122P provides the readout value $Rq_4$. In addition, the second photodiode 122Q provides the readout value $Rq_5$, the second photodiode 122R provides the readout value $Rq_6$, the second photodiode 122S provides the readout value $Rq_7$, and the second photodiode 122T provides the readout value $Rq_8$. For the component interpolated value in the second diagonal direction D2, n is noted as "q" and the equation III is expanded and expressed as $$V_q=\frac{(Rq_1\times F_1+Rq_2\times F_2+Rq_3\times F_3+Rq_4\times F_4+Rq_5\times F_5+Rq_6\times F_6+Rq_7\times F_7+Rq_8\times F_8)}{(F_1+F_2+F_3+F_4+F_5+F_6+F_7+F_8)},$$

wherein Vq is the component interpolated value in the second diagonal direction D2, $Rq_1$~$Rq_8$ are readout values of the selected eight second photodiodes 122, respectively, and $F_1$~$F_8$ are component weight values determined by the position of the corresponding second photodiode 122.

The second photodiode 122M and the second photodiode 122N are located at a first side of the target position (4, 4) and the second photodiode 122M is more adjacent to the target position (4, 4) than the second photodiode 122N. The component weight value $F_1$ for the readout value $Rq_1$ is greater than the component weight value $F_2$ for the readout value $Rq_2$. For example, the component weight value $F_1$ may be 3 while the component weight value $F_2$ may be 1. The second photodiode 122Q and the second photodiode 122R are located at a first side of the target position (4, 4) and the second photodiode 122Q is more adjacent to the target position (4, 4) than the second photodiode 122R. The component weight value $F_5$ for the readout value $Rq_5$ is greater than the component weight value $F_6$ for the readout value $Rq_6$. For example, the component weight value $F_5$ may be 3 while the component weight value $F_6$ may be 1.

Simultaneously, the second photodiode 122O and the second photodiode 122P are located at a second side of the target position (4, 4) and the second photodiode 122O is more adjacent to the target position (4, 4) than the second photodiode 122P. The component weight value $F_3$ for the readout value $Rq_3$ may be 3 while the component weight value $F_4$ for the readout value $Rq_4$ may be 1. The second photodiode 122S and the second photodiode 122T are located at a second side of the target position (4, 4) and the second photodiode 122S is more adjacent to the target position (4, 4) than the second photodiode 122T. The component weight value $F_7$ for the readout value $Rq_7$ may be 3 while the component weight value $F_8$ for the readout value $Rq_8$ may be 1. In some embodiments, the values of $F_1$~ $F_8$ may be a combination of other values, which satisfies $F_1>F_2$, $F_3>F_4$, $F_5>F_6$, and $F_7>F_8$.

After obtaining the component interpolated values Vh, Vv, Vp, and Vq at the target position (4, 4) in the four directions, the horizontal direction H, the vertical direction V, the first diagonal direction D1, and the second diagonal direction D2, the interpolated value of the second photodiodes 122 at the target position (4, 4) is obtained by an equation IV:

$$G_{int} = \left(\sum Y_n \times V_n\right) / \sum Y_n,$$

wherein $G_{int}$ is the interpolated value, $Y_n$ is the weight factor of the process window in a component direction of the various directions, $V_n$ is the component interpolated value in the component direction of the various directions, and n indicates the component direction. In the embodiment, the $Y_n$ may be obtained by performing the steps depicted in FIG. 3 to FIG. 6 and the $V_n$ may be obtained by performing the steps depicted in FIG. 7 to FIG. 10. Specifically, for the interpolated value $G_{int}$ of the second photodiodes 122 at the target position (4, 4), the equation IV may be expanded and expressed as $$G_{int} = \frac{(Y_h \times V_h + Y_v \times V_v + Y_p \times V_p + Y_q \times V_q)}{(Y_h + Y_v + Y_p + Y_q)},$$

wherein h represents the horizontal direction H as the component direction, v represents the vertical direction V as the component direction, p represents the first diagonal direction D1 as the component direction, and q represents the second diagonal direction D2 as the component direction.

Figure 11:
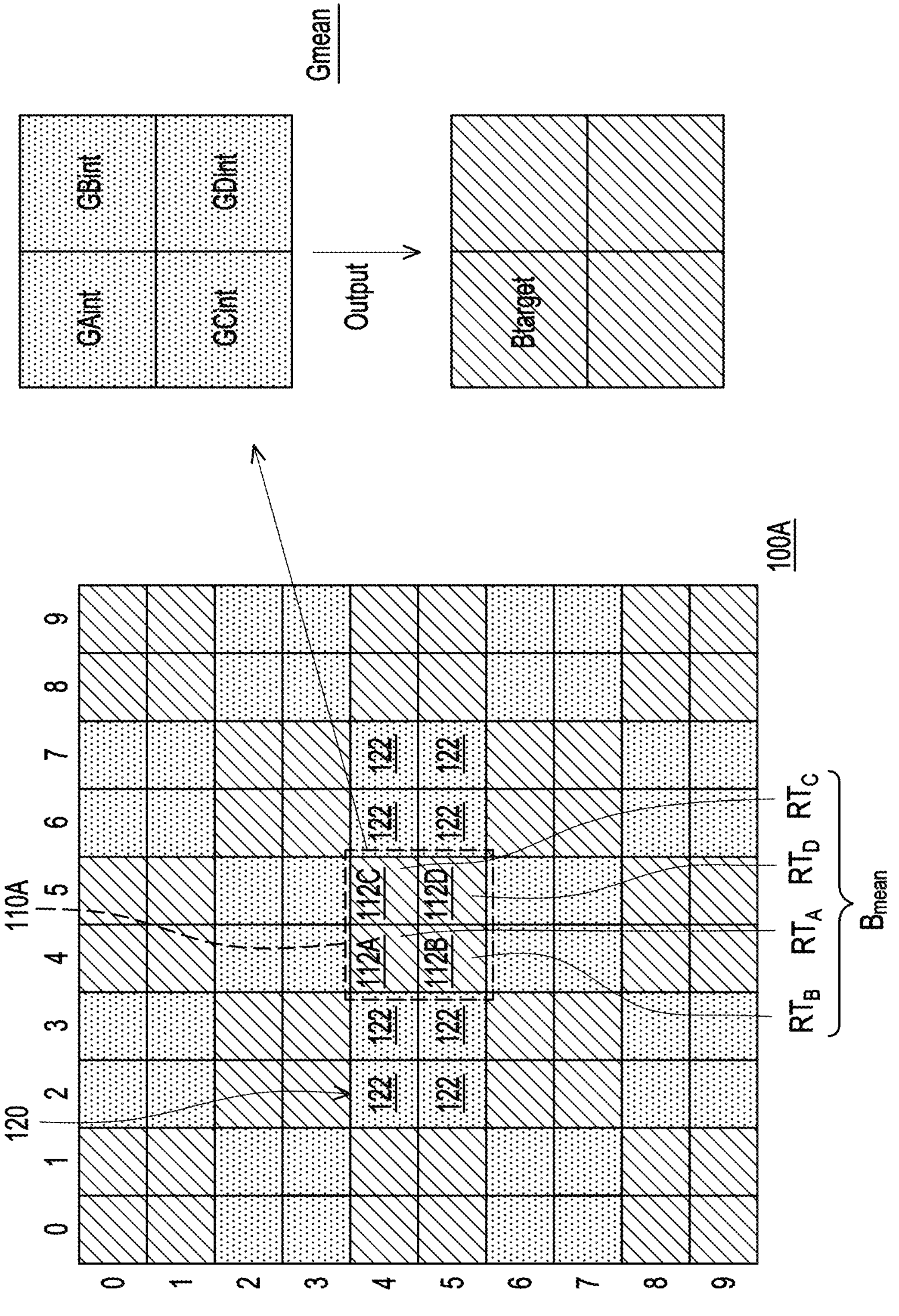
FIG. 11 schematically illustrate a method of estimating a corrected value of the first photodiode for correcting image data of an image sensor.

FIG. 11 schematically illustrate a method of estimating a corrected value of the first photodiode for correcting image data of an image sensor, in which the photodiode array 100A is selected from the image sensor 100 depicted in FIG. 1 as the process window. In FIG. 11, the method shows the readout value $RT_A$ of the target first photodiode 112A located at the target position (4, 4) being corrected as an example, and each of the first photodiode 112 in the image sensor 100 shown in FIG. 1 may be corrected by using the same method. In the embodiment, the target first photodiode 112A belongs to the corresponding first pixel array 110A surrounded by the dash square and the corresponding first pixel array 110A includes four photodiodes, the first photodiodes 112A~122D.

As described in FIG. 1, the first photodiodes 112A~122D shares one single microlens 114 and may provide imprecise readout values due to certain optical side effect of sharing microlens, when being compared to the second photodiodes 122. However, the total energy received by the first photodiodes 112A~122D in one first pixel array 110 is least likely influenced by the optical effect and is substantially equivalent to the second photodiodes 122 in one second pixel array 120. Accordingly, the mean of the readout values provided by the first photodiodes 112A~122D may be precise and reliable. In addition, the readout values of the second photodiodes 122 are precise and reliable since the second photodiodes 122 are implemented under the 4C (4 cell) configuration. The correction method in the embodiment may be processed based on an assumption that a first ratio of the readout value $RT_A$ of the target first photodiode 112A to the mean of the readout values provided by the first photodiodes 112A~122D is the same as a second ratio of the interpolated value of the second photodiodes 122 at the position (4, 4) of the target first photodiode 112A to a mean of the interpolated values of the second photodiodes 122 at the positions of the first photodiodes 112A~122D.

The target first photodiode 112A is configured to provide the readout values $RT_A$, the first photodiode 112B is configured to provide the readout values $RT_B$, the first photodiode 112C is configured to provide the readout values $RT_C$, and the first photodiode 112D is configured to provide the readout values $RT_D$. In the embodiment, the interpolated values of the second photodiodes 122 at the positions of the first photodiodes 112A~122D may be obtained by performing the method depicted in FIG. 7 to FIG. 10 for each position of the first photodiodes 112A~122D to obtain respective interpolated values $GA_{int}$, $GB_{int}$, $GC_{int}$, and $GD_{int}$, and calculating the mean $G_{mean}$ of the respective interpolated values $GA_{int}$, $GB_{int}$, $GC_{int}$, and $GD_{int}$.

Specifically, in the embodiment, a corrected value of each of the first photodiodes 112A~112D may be obtained by the equation I: $B_{target}=G_{int}\times(B_{mean}/G_{mean})$, wherein $B_{target}$ is the corrected value of the each of the first photodiodes (the target first photodiode 112A is taken as an example), $G_{int}$ is the interpolated value of the second photodiodes 112 at a position of the one of the first photodiodes 112A~112D, $B_{mean}$ is a mean of readout values of corresponding first photodiodes 112A~112D in the first pixel group 110A including the target first photodiode 112A and $G_{mean}$ is a mean of the interpolated values $GA_{int}$, $GB_{int}$, $GC_{int}$, and $GD_{int}$ of the second photodiodes 122 at positions of the corresponding first photodiodes 112A~112D in the first pixel group 110A. Then, the corrected value $B_{target}$ is output to served as the sensed image data of the target first photodiode 112A in the image sensor.

In view of the above, the method of correcting image data of an image sensor in accordance with the embodiments of the disclosure utilizes in a pixel array implemented by a half-QPD configuration. The readout values of the photodiodes under the QPD design are corrected by using the interpolated values of the photodiodes under 4C (4 cell) design. The corrected values are more precise than the individual readout values of the photodiodes under the QPD design since the imprecise of the individual readout values of the photodiodes would be caused under the QPD design. The image sensor outputs the image data using the corrected values for the photodiodes under the QPD design rather than the individual readout values of the photodiodes under the QPD design and thus the output image data involves good image quality.

In some embodiments of the disclosure, a method of correcting image data of an image sensor, wherein the image sensor is connected to a processing computer and comprises first pixel groups and second pixel groups alternately arranged along a horizontal direction and a vertical direction, each of the first pixel groups comprises four first photodiodes commonly covered by a first microlens, each of the second pixel groups comprises four second photodiodes respectively covered by four microlenses. The method includes collecting a process window from the image sensor; obtaining weight factors of the process window in various directions based on readout values of the second photodiodes in the process window; obtaining interpolated values of the second photodiodes at positions of the first photodiodes in the first pixel groups in the process window by using the weight factors; and estimating a corrected value of a target first photodiode of the first photodiodes by an equation I: $B_{target}=G_{int}\times(B_{mean}/G_{mean})$, wherein $B_{target}$ is the corrected value of the target first photodiode of the first photodiodes, $G_{int}$ is the interpolated value of the second photodiodes at a position of the target first photodiode, $B_{mean}$ is a mean of readout values of first photodiodes in a corresponding first pixel group including the target first photodiode and $G_{mean}$ is a mean of the interpolated values of the second photodiodes at positions of the first photodiodes in the corresponding first pixel group.

In some embodiments of the disclosure, the process window comprises 10×10 of photodiodes among the first photodiodes and the second photodiodes. Each of the weight factors in a component direction of the various directions is obtained by: obtaining intra-gradients of the readout values of the second photodiodes in the component direction by calculating an absolute value of a difference between the readout values of two adjacent second photodiodes in the component direction; obtaining global-gradients of binned values of the second pixel groups in the component direction by calculating an absolute value of a difference of binned values of two adjacent second pixel groups, wherein the binned value of each of the second pixel groups is obtained by binning the readout values of the four second photodiodes in the each of the second pixel groups; multiplying a sum of the intra-gradients and a sum of the global-gradients in the component direction to obtain a gradient value; and determining the weight factor based on the gradient value in the component direction, wherein the greater the gradient value is the smaller the weight factor is.

In some embodiments of the disclosure, the gradient value in the component direction is converted to the weight factor in the component direction by an equation II: $Y_n=X_n^{(-\theta)}$, wherein $Y_n$ is the weight factor, $X_n$ is the gradient value, n indicates the component direction and θ is a positive number. θ is selected from 0.7~3.0.

In some embodiments of the disclosure, the various directions comprise the horizontal direction, the vertical direction, a first diagonal direction and a second diagonal direction.

In some embodiments of the disclosure, the interpolated values of the second photodiodes at a position of the target first photodiode is obtained based on component interpolated values in the various directions.

In some embodiments of the disclosure, one of the component interpolated values in a component direction of the various directions is obtained from readout values of m second photodiodes, m is a multiple of 2, and the m second photodiodes are arranged in the component direction and adjacent to the position of the target first photodiode, and equally located at opposite sides of the position of the target first photodiode in the component direction. The one of the component interpolated values in the component direction is obtained by an equation III:

$$V_n = \left(\sum\nolimits_{i=1}^{m} Rn_i \times F_i\right) / \sum\nolimits_{i=1}^{m} F_i,$$

wherein Vn is the component interpolated value in the component direction, n indicates the component direction, $Rn_i$ is a readout value of an $i^{th}$ of the m second photodiodes, and $F_i$ is a component weight value. In some embodiments of the disclosure, $F_i$ is larger for one of the m second photodiodes more adjacent to the position of the target first photodiode than another of the m second photodiodes relatively further than the position of the target first photodiode. In some embodiments of the disclosure, $F_i$ is larger for one of the m second photodiodes more adjacent to a target first pixel group including the target first photodiode than another of the m second photodiodes relatively further than the target first pixel group.

In some embodiments of the disclosure, each of the interpolated values is obtained by an equation $$G_{int} = \left(\sum Y_n \times V_n\right) / \sum Y_n, \quad \text{IV}$$

wherein $G_{int}$ is the interpolated value, $Y_n$ is the weight factor of the process window in a component direction of the various directions, $V_n$ is the component interpolated value in the component direction, and n indicates the component direction.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of correcting image data of an image sensor, wherein the image sensor is connected to a processing computer and comprises first pixel groups and second pixel groups alternately arranged along a horizontal direction and a vertical direction, each of the first pixel groups comprises four first photodiodes commonly covered by a first microlens, each of the second pixel groups comprises four second photodiodes respectively covered by four microlenses, and the method comprises:

collecting a process window from the image sensor;

obtaining weight factors of the process window in various directions based on readout values of the second photodiodes in the process window;

obtaining interpolated values of the second photodiodes at positions of the first photodiodes in the first pixel groups in the process window by using the weight factors; and estimating a corrected value of a target first photodiode of the first photodiodes by an equation I:

$$B_{target} = G_{int} \times \left(B_{mean}/G_{mean}\right)$$

wherein $B_{target}$ is the corrected value of the target first photodiode of the first photodiodes, $G_{int}$ is the interpolated value of the second photodiodes at a position of the target first photodiode, $B_{mean}$ is a mean of readout values of first photodiodes in a corresponding first pixel group including the target first photodiode and $G_{mean}$ is a mean of the interpolated values of the second photodiodes at positions of the first photodiodes in the corresponding first pixel group.

2. The method of claim 1, wherein the process window comprises 10×10 of photodiodes among the first photodiodes and the second photodiodes.

3. The method of claim 1, wherein each of the weight factors in a component direction of the various directions is obtained by:

obtaining intra-gradients of the readout values of the second photodiodes in the component direction by calculating an absolute value of a difference between the readout values of two adjacent second photodiodes in the component direction;

obtaining global-gradients of binned values of the second pixel groups in the component direction by calculating an absolute value of a difference of binned values of two adjacent second pixel groups, wherein the binned value of each of the second pixel groups is obtained by binning the readout values of the four second photodiodes in the each of the second pixel groups;

multiplying a sum of the intra-gradients and a sum of the global-gradients in the component direction to obtain a gradient value; and determining the weight factor based on the gradient value in the component direction, wherein the greater the gradient value is the smaller the weight factor is.

4. The method of claim 3, wherein the gradient value in the component direction is converted to the weight factor in the component direction by an equation II:

$Y_n = X_n^{(-\theta)}$, wherein $Y_n$ is the weight factor, $X_n$ is the gradient value, n indicates the component direction and θ is a positive number.

5. The method of claim 4, wherein θ is selected from 0.7~3.0.

6. The method of claim 1, wherein the various directions comprise the horizontal direction, the vertical direction, a first diagonal direction and a second diagonal direction.

7. The method of claim 1, wherein the interpolated values of the second photodiodes at a position of the target first photodiode is obtained based on component interpolated values in the various directions.

8. The method of claim 7, wherein one of the component interpolated values in a component direction of the various directions is obtained from readout values of m second photodiodes, m is a multiple of 2, and the m second photodiodes are arranged in the component direction and adjacent to the position of the target first photodiode, and equally located at opposite sides of the position of the target first photodiode in the component direction.

9. The method of claim 8, wherein the one of the component interpolated values in the component direction is obtained by an equation III:

$$V_n = \left(\sum_{i=1}^{m} Rn_i \times F_i\right) / \sum_{i=1}^{m} F_i$$

Vn is the component interpolated value in the component direction, n indicates the component direction, $Rn_i$ is a readout value of an $i^{th}$ of the m second photodiodes, and $F_i$ is a component weight value.

10. The method of claim 9, wherein $F_i$ is larger for one of the m second photodiodes more adjacent to the position of the target first photodiode than another of the m second photodiodes relatively further than the position of the target first photodiode.

11. The method of claim 9, wherein $F_i$ is larger for one of the m second photodiodes more adjacent to a target first pixel group including the target first photodiode than another of the m second photodiodes relatively further than the target first pixel group.

12. The method of claim 7, wherein each of the interpolated values is obtained by an equation IV:

$$G_{int} = \left(\sum Y_n \times V_n\right) / \sum Y_n,$$

wherein $G_{int}$ is the interpolated value, $Y_n$ is the weight factor of the process window in a component direction of the various directions, $V_n$ is the component interpolated value in the component direction, and n indicates the component direction.

* * * * *